(12) United States Patent
Wang et al.

(10) Patent No.: US 11,862,289 B2
(45) Date of Patent: Jan. 2, 2024

(54) SUM ADDRESS MEMORY DECODED DUAL-READ SELECT REGISTER FILE

(71) Applicant: International Business Machines Corporation, Armonk, NY (US)

(72) Inventors: Geoffrey Wang, Austin, TX (US); Michael Lee, Austin, TX (US); Kevin D. Tran, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 382 days.

(21) Appl. No.: 17/345,299

(22) Filed: Jun. 11, 2021

(65) Prior Publication Data

US 2022/0399046 A1    Dec. 15, 2022

(51) Int. Cl.
  *G06F 7/505*   (2006.01)
  *G06F 7/74*    (2006.01)
  *G11C 7/10*    (2006.01)
  *G11C 7/12*    (2006.01)

(52) U.S. Cl.
  CPC ............ *G11C 7/1096* (2013.01); *G06F 7/505* (2013.01); *G06F 7/74* (2013.01); *G11C 7/103* (2013.01); *G11C 7/1069* (2013.01); *G11C 7/12* (2013.01)

(58) Field of Classification Search
  CPC ..... G11C 7/1096; G11C 7/103; G11C 7/1069; G11C 7/12; G06F 7/505; G06F 7/74
  USPC ........................................................ 711/219
  See application file for complete search history.

(56) References Cited

U.S. PATENT DOCUMENTS

| | | | |
|---|---|---|---|
| 5,392,411 A | 2/1995 | Ozaki | |
| 7,073,039 B2 | 7/2006 | Kirsch | |
| 7,710,814 B2 | 5/2010 | Lambrache et al. | |
| 2011/0264892 A1 | 10/2011 | Nakashima et al. | |
| 2015/0058575 A1* | 2/2015 | Sobel | G11C 7/12 711/133 |
| 2019/0189196 A1* | 6/2019 | Robison | G11C 7/12 |

FOREIGN PATENT DOCUMENTS

| | | |
|---|---|---|
| CN | 103440210 A | 12/2013 |
| CN | 104317554 B | 2/2017 |
| KR | 0154725 B1 | 11/1998 |

OTHER PUBLICATIONS

Raymond Heald et al., "64-Kbyte Sum-Addressed-Memory Cache with 1.6-ns Cycle and 2.6-ns Latency," IEEE Journal of Solid-State Circuits, vol. 33, No. 11, Nov. 1998. pp. 1682-1689.

* cited by examiner

*Primary Examiner* — Ly D Pham
(74) *Attorney, Agent, or Firm* — Jeffrey Ingalls; Cantor Colburn LLP (57) ABSTRACT

Aspects of the invention include decoding a base address and an offset to generate a first potential memory address and a second potential memory address. A first cell data associated with the first potential memory address of a first partitioned array and a second cell data associated with a second partitioned array are evaluated. Carry-out bit information is received from a summing operation of the base address and the offset, the operating being performed in parallel to the decoding. The carry-out bit information is used to select either the first cell data or the second cell data.

20 Claims, 5 Drawing Sheets

SUM ADDRESS MEMORY DECODED DUAL-READ SELECT REGISTER FILE

BACKGROUND

The present invention generally relates to computer architecture, and more specifically, to computer architecture configured for a sum address memory decoded dual-read select register file.

Cache memory is a small, temporary memory used for synchronizing and speeding up a high-speed central processing unit (CPU) of a computing system. The cache memory is located closer to the CPU than the main memory of the computing system and is generally divided into multiple hierarchal levels (L1, L2, and L3). The cache memory acts as a buffer between the CPU and the main memory by storing copies of frequently used instructions and data from the main memory. The CPU can speed up its processing by retrieving instructions or data from the smaller cache memory rather than retrieving the instructions or data from the larger main memory.

SUMMARY

Embodiments of the present invention are directed to a computer-implemented method for a sum address memory decoded dual-read select register file. A non-limiting example of the computer-implemented method includes decoding a base address and an offset to generate a first potential memory address and a second potential memory address. A first cell data associated with the first potential memory address of a first partitioned array and a second cell data associated with a second partitioned array are evaluated. Carry-out bit information is received from a summing operation of the base address and the offset, the operating being performed in parallel to the decoding. The carry-out bit information is used to select either the first cell data or the second cell data.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 5 illustrates a block diagram of a computer system for use in implementing one or more embodiments of the present invention The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provide computer-implemented methods, computing systems, and computer program products for a custom register file, in which an address sum operation and a register file read access are combined into a single operation to decrease latency between receiving the first operand and the second operand and retrieving data from memory.

Central processing units (CPUs) execute program instructions by retrieving instructions and data stored as elements in memory. Memory elements (e.g., instructions and data) are generally not indexed by complete memory addresses, but rather by a base address and an offset. The base address is an address of an element that acts as a reference point for addresses of other elements stored in memory. The offset is a distance of a desired memory element from the base address. The CPU causes the base address to be added to the offset to help determine the memory address or virtual address of the desired memory element. This address base plus offset addressing operation is in the path of cache access operations of a CPU using set associative cache structures. When the CPU is operating at a high frequency, the delay associated with the addition of addresses and register file access typically takes multiple clock cycles.

One or more embodiments of the present invention address one or more of the above-described shortcomings by providing computer-implemented methods, computing systems, and computer program products that sum and decode the most significant bits of a first operand and the most significant bits of a second operand to generate a first potential memory address and a sequential second potential memory address of a desired data. A single bitline stage evaluation is used to produce the data associated with the first potential memory address from a first partitioned array, and, in parallel, another single bitline stage evaluation is used to produce the data associated with the second potential memory address from a second partitioned array. An external adder operates in parallel with the decoder and performs a summing operation using all bits of the first operand and all bits of the second operand to determine whether an appropriate carry-out bit is generated at the completion of the operation. Based on the presence or absence of the appropriate carry-out bit, either the data associated with the first potential memory address from the first partitioned array, or the data associated with the second potential memory address from the second partitioned array, is selected for output as the final desired data.

Figure 1:
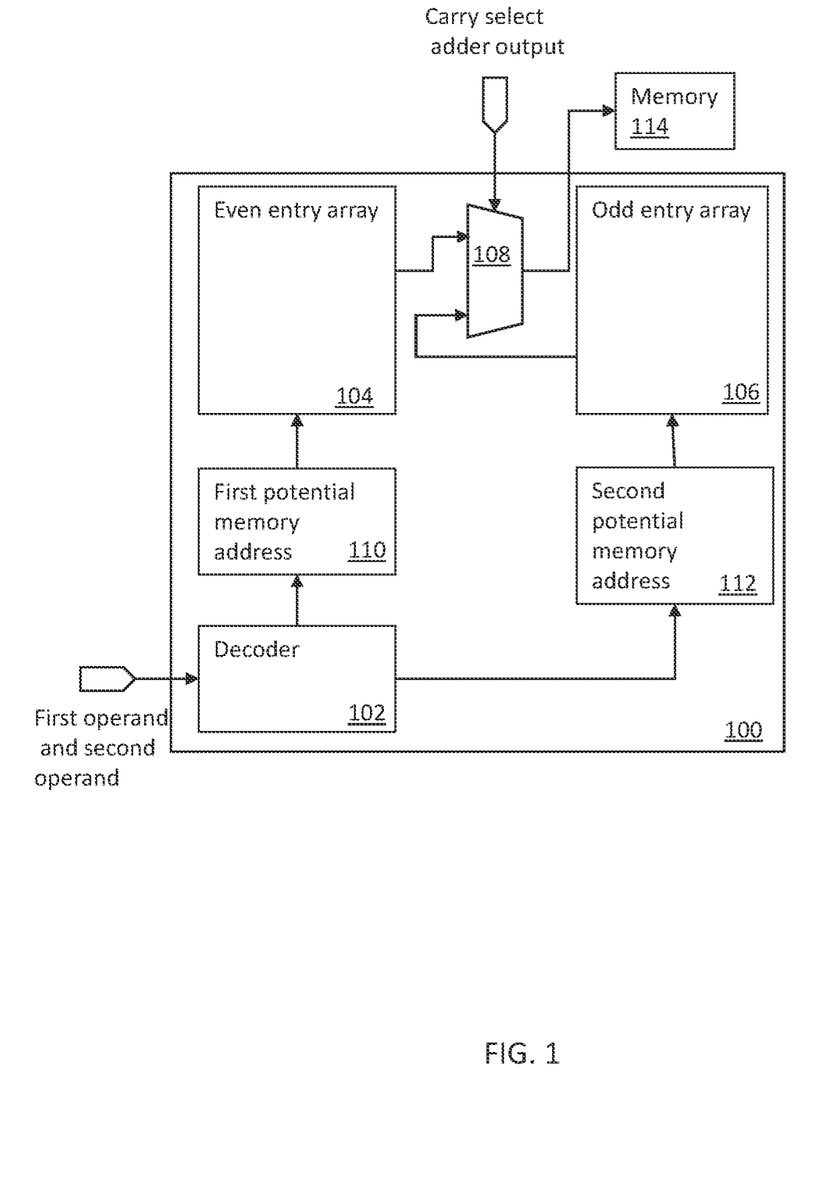
FIG. 1 illustrates a register file array arrangement according to embodiments of the present invention.

Referring to FIG. 1, a register file array arrangement 100 is shown in accordance with embodiments of the present invention. It should be appreciated that some or all of the register file array arrangement 100 can be implemented in a computer system, for example, the computer system 500 of FIG. 5. The register file array arrangement 100 includes a decoder 102 for decoding an m-bit first operand (e.g., a base address) and an n-bit second operand (e.g., an offset) to output a pair of potential memory addresses.

Figure 3:
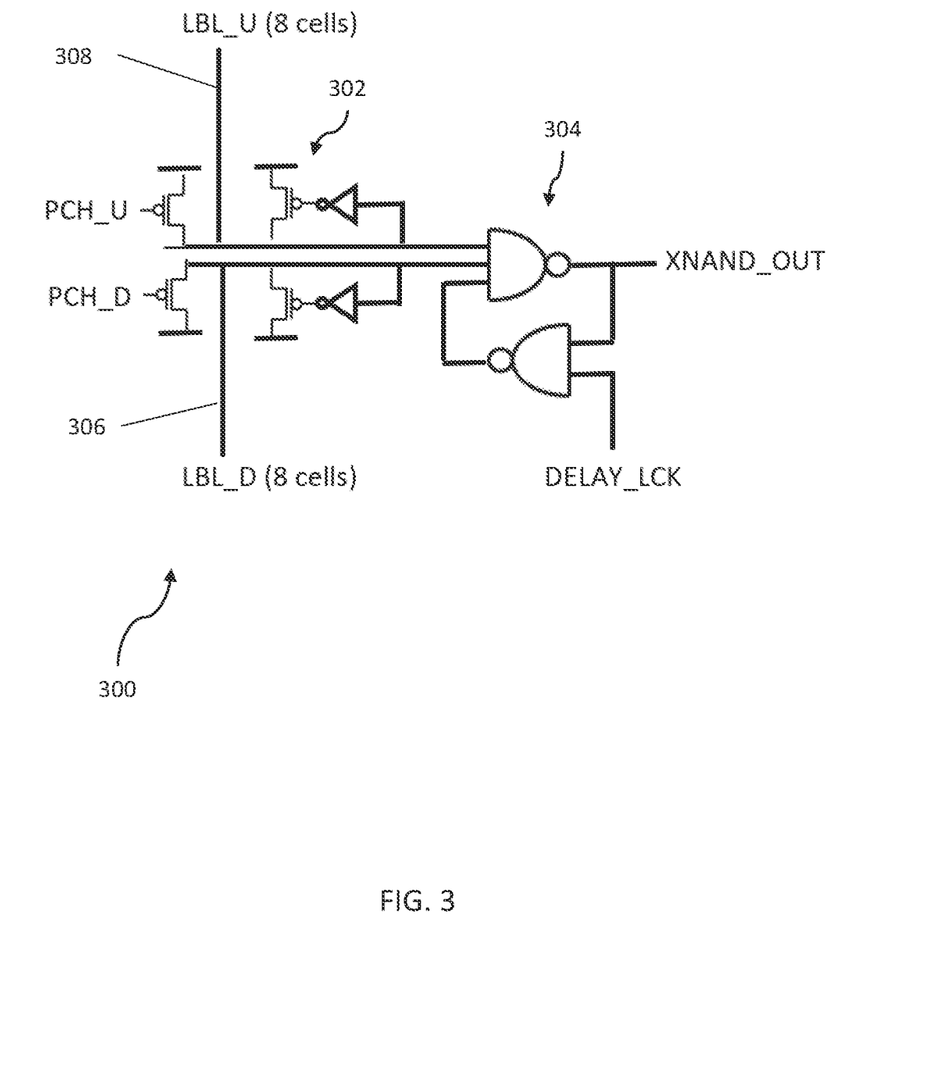
FIG. 3 illustrates a single bit line state evaluation circuit according to embodiments of the present invention.

The decoder 102 is further in communication with a register file array that has been partitioned into an even entry array 104 and an odd entry array 106. The even entry array 104 holds data that has even valued memory addresses and the odd entry array 106 holds data that has odd valued memory addresses. The decoder 102 implements sum address decoding in order to generate a 2-hot decoded bit vector (sum and sum+1). One of the hot bit vectors selects a read word line in the even entry array 104 and the other hot bit vector selects a read word line in the odd entry array 106 in parallel. Each bit position in each array uses a respective single bitline stage evaluation circuit (see. FIG. 3) to evaluate the data associated with the respective selected read word line. One or more embodiments of the decoder 102 do not perform a bitwise carry-over operation using the LSBs of the first operand and the second operand. Therefore, only one of two generated potential memory addresses 110 112 is the desired memory address and the other generated potential memory address 110 112 is off by a carry-out bit.

Once the two potential memory addresses 110 112 are decoded, the even entry array 104 outputs the data from the first potential memory address 110 to a multiplexer 108 and the odd entry array 106 outputs the data from the second potential memory address 112 to the multiplexer 108. The first potential memory address 110 can be considered xxxx, whereas the second potential memory address 112 can be thought of as xxxx+1, or vice-versa. The difference between the xxxx address and the xxxx+1 address is a carry-out bit generated by the summation of the first operand and the second operand. It should be appreciated that although the example memory addresses suggest five bits, the memory addresses can be any number of bits. The multiplexer 108 initially outputs the data of the first memory address unless a carry-out bit is received. If a carry-out bit is received, the multiplexer 108 shifts to outputting the data of the second memory address.

External to the register file array arrangement 100, an adder (e.g., a carry select adder) adds the first operand (e.g., base address) and the second operand (e.g., offset). In some embodiments of the present invention, the adder can also perform a subtraction operation depending on the desired mode of operation. The adder is in communication with the multiplexer 108 which is operable to receive carry-out bit information from the adder. If, for example, the adder performs the operation and no appropriate carry-out bit is generated, the multiplexer 108 outputs the data of the first memory address. If however, the adder performs the operation and the appropriate carry bit is generated, the multiplexer 108 shifts to outputting the data of the second memory address.

As an exemplary illustration, a first operand (base address) and a second operand (offset) are partitioned between their MSBs and their LSBs. The MSBs of the base address and the offset are transmitted to a decoder 102. The entirety of the base address and the offset are sent to an external adder (not shown). The decoder 102 decodes the MSBs of the base address and offset and generates a first potential memory address 110 and a second potential memory address 112. The decoder 102 decodes the MSBs of the first operand and the second operand to generate a first potential memory address 110 and a second potential memory address 112. The data associated with the first potential memory address 110 and the data associated with the second potential memory address 112 are fed into respective single bit line state evaluation circuits which read the even entry array 104 and the odd entry array 106. In response to reading data from the first potential memory address 110 and reading data from the second potential memory address 112, the data from the two potential addresses are output to a multiplexer 108. In parallel with the decoding operation, an external adder performs a summing operation on the entirety of the base address and the offset. If no appropriate carry-out bit is generated, the multiplexer 108 outputs the data of the first memory address. If however, the adder performs the operation and the appropriate carry bit is generated, the multiplexer 108 shifts to outputting the data of the second memory address. The register file data output is compared to an effective address hash, with the result latched and sent to memory 114 as mux select signals.

Figure 2:
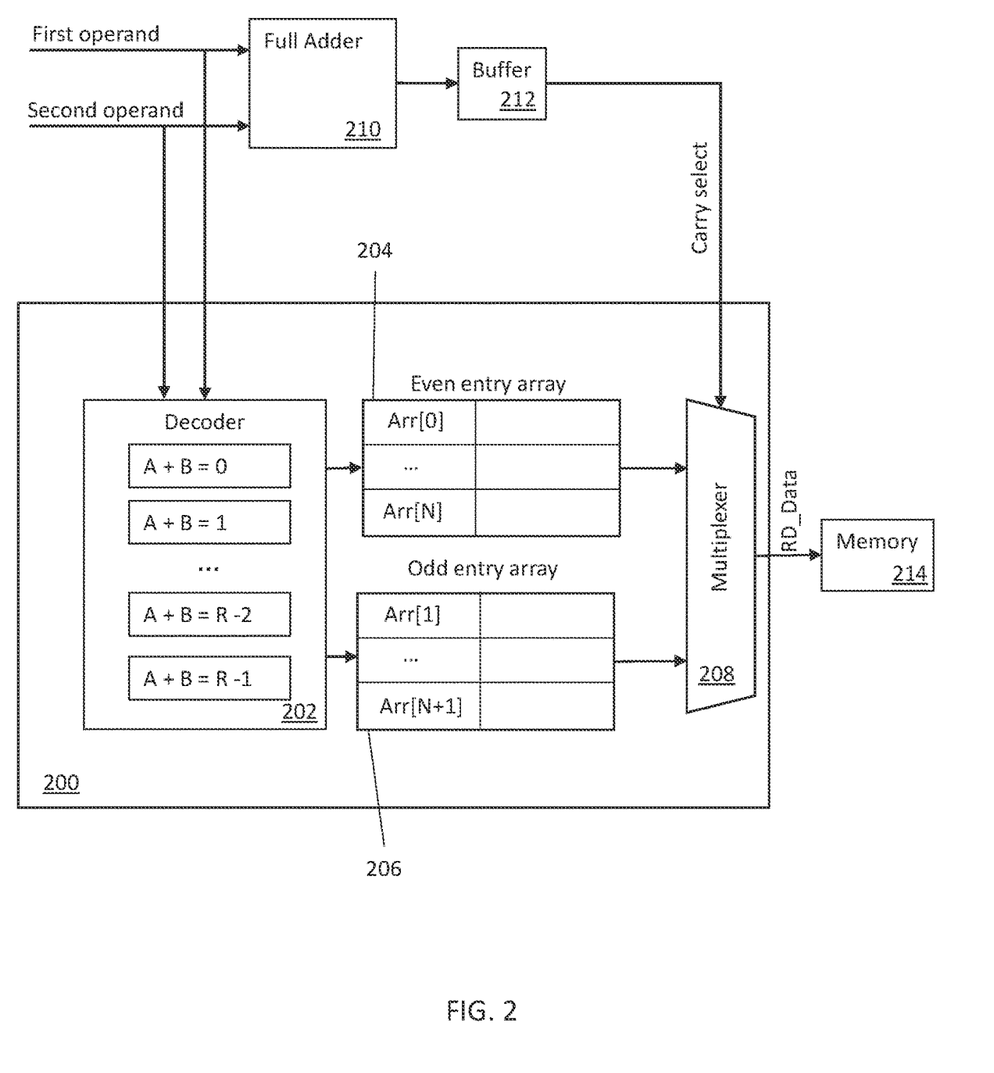
FIG. 2 illustrates a register file array arrangement according to embodiments of the present invention.

Referring to FIG. 2, a register file array 200 is shown in accordance with embodiments of the present invention. A decoder 202 decodes a first operand and a second operand to identify a potential memory address of a desired data. The first operand can be a base address of a memory address and the second operand can be an offset of the memory address. The decoder 202 respectively identifies a potential memory address at an even entry array 204 and an odd entry array 206. The potential memory address are sequential memory addresses, for example, Arr[K] and Arr[K+1]. The even entry array 204 and the odd entry array 206 each output data to a multiplexer 208.

The first operand and the second operand sent to an adder 210 simultaneously with the decoder 202. In some embodiments of the present invention, the adder 202 is a combination of XOR gates and multiplexers (not shown). The adder 202 can be a sequence of multiple adders that are each operable to receive a carry-in bit from a previous adder, perform a summing operation, and output a carry-out bit to a next adder of the sequence. The adder 210 receives the entirety of the first operand and the second operand to perform a summing operation to determine whether the appropriate carry-out bit is generated. The adder 210 works in parallel with the decoder 202 to reduce latency between receiving the first operand and the second operand and retrieving data from memory. The adder 210 then transmits a logical one or zero to a buffer 212. A logical zero is transmitted if the appropriate adder of the sequence of adders does not generate a carry-out bit. A logical one is transmitted if the appropriate adder of the sequence of adders does generate a carry-out bit. The buffer 212 includes a clock and outputs the logical zero or one at a predetermined number of clock cycles.

The multiplexer 208 outputs the value of the lower value memory address (e.g., Arr[K]). If the adder 210 does not output the appropriate carry-over bit, the buffer 212 transmits a logical zero to the multiplexer 208, which in turn outputs the lower value memory address. If the adder 210 does output the appropriate carry-over bit, the buffer 212 transmits a logical one to the multiplexer 208, which in turn outputs the higher value memory address (e.g., Arr[K+1]). The outputted register file data output is compared to an effective address hash, with the result latched and sent to memory 114 as multiplexer select signals.

Referring to FIG. 3, an illustration of a single bitline stage evaluation circuit 300 is shown according to embodiments of the present invention. Although only one circuit is illustrated, it should be appreciated that each bit position or column of the even entry array 204 and each bit position or column of the odd entry array 206 include a single bitline stage evaluation circuit 300. The single bitline stage evaluation circuit 300 includes a keeper device 302 and a cross-coupled latch 304. Each of the even entry array 204 and the odd entry array 206 are subdivided into a lower value half entries (cells) and a higher value half entries (cells). The lower value half entries are connected to a first local bitline 306 and the higher value half entries are connected to a second local bitline 308. As illustrated in FIG. 3 each half includes eight entries (cells). Each of the first local bitline 306 and second local bitline 308 are pre-charged to a voltage midway between a "0" and a "1". The cross-coupled latch 304 detects the data associated with the selected memory address (cell) generated by the decoder 202 at either the first local bitline 306 or the second local bitline 308 based on a change in the voltage across one of the bitlines. The bitline connected to the entries that were not selected remains in the pre-charged state. In some embodiments of the present invention, the latch 304 includes two NAND gates configured to latch to the value of the data associated with the selected memory address from the even entry array 204 or the odd entry array 206 that matches the memory address generated by the decoder 202 until such time the data associated with the memory address is released.

Figure 4:
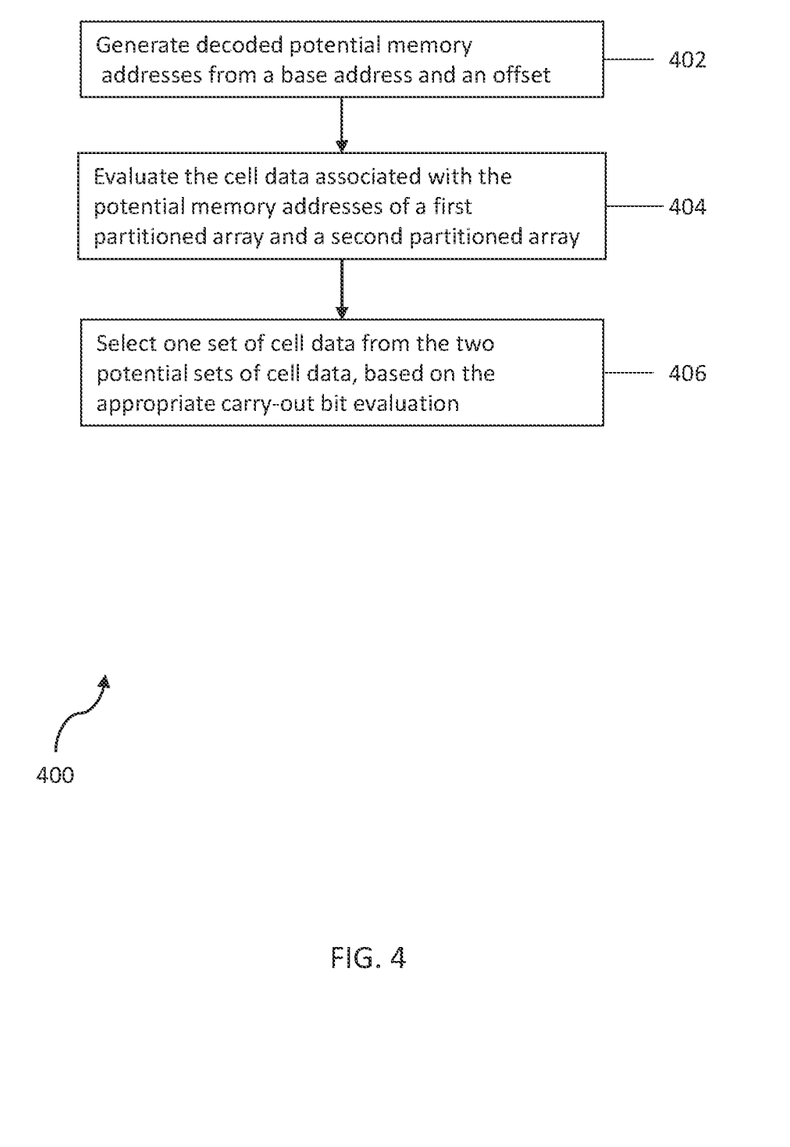
FIG. 4 illustrates a flow diagram for combining an address sum operation and a register file read access operation according to embodiments of the present invention.

Referring to FIG. 4, a flow diagram 400 for a sum addressed decoding, and dual-late read late-select is shown in accordance with embodiments of the present invention. At block 402, the decoder 102 generates two potential memory addresses from a base address and an offset. For example, the base address and the offset are partitioned between their most significant bits (MSBs) and their least significant bits (LSB). A decoder 102 performs sum address decoding of the MSB from the base address and the offset address to generate two potential memory addresses for a desired data. The two potential memory addresses are sequential memory addresses, in which the desired data can be found at one or the other address.

At block 404, the memory addresses generated by the decoder are used to evaluate the register file array. For example, the register file array is subdivided into an even entry array 104 and an odd entry array 106, where the even entry array 104 stores data associated with memory addresses that have an even value and odd entry array 106 stores data associated with memory addresses that have an odd value. The decoder 102 activates one read word line from the even entry array 104, whose cell contents get evaluated by a single bitline stage evaluation circuit 300 located at each bit position of the even entry array 104, and the decoder 102 activates one read word line from the odd entry array 106, whose cell contents get evaluated by a single bitline stage evaluation circuit 300 located at each bit position of the odd entry array 106. Each single bitline stage evaluation circuit 300 latches and sends its received cell data from the selected memory address to the multiplexer 108, such that there is a complete set of read data corresponding to the selected memory address from the even entry array 104 at one input of the multiplexer, and another complete set of read data corresponding to the selected memory address from the odd entry array 106 at the other input of the multiplexer. The implementation of the single bitline evaluation circuit 300 is enabled by the relatively smaller size (i.e., total number of words or entries) of the register file array.

At block 406, the multiplexer 108 selects one set of read data from the two potential sets of read data. For example, as the decoder 202 is decoding the most significant bits of the two operands, an external adder 210 sums the entirety of the base address and the offset to determine if the appropriate carry-out bit remains upon completion of the summing. If no appropriate carry-out bit remains at the completion of the summing, the adder 210 transmits a logical zero to the multiplexer 108. If the appropriate carry-out bit remains at the completion of the summing, the adder 210 transmits a logical one to the multiplexer 108. In other words, the multiplexer 108 does not receive carry-out bit information until after each single bitline stage evaluation circuit 300 has evaluated the cell data associated with the potential memory addresses in both the even entry array 104 and odd entry array 106. The multiplexer 108 is outputting data from one of the two potential memory addresses. If the multiplexer 108 receives a logical zero, it transmits the data from the first potential memory address. If the multiplexer 108 receives a logical one, it shifts to transmitting the data from the second potential memory address. Whichever of the data from the first potential memory address and the second potential memory address is ultimately selected, is the final data that is read out from the register file array.

Figure 5:
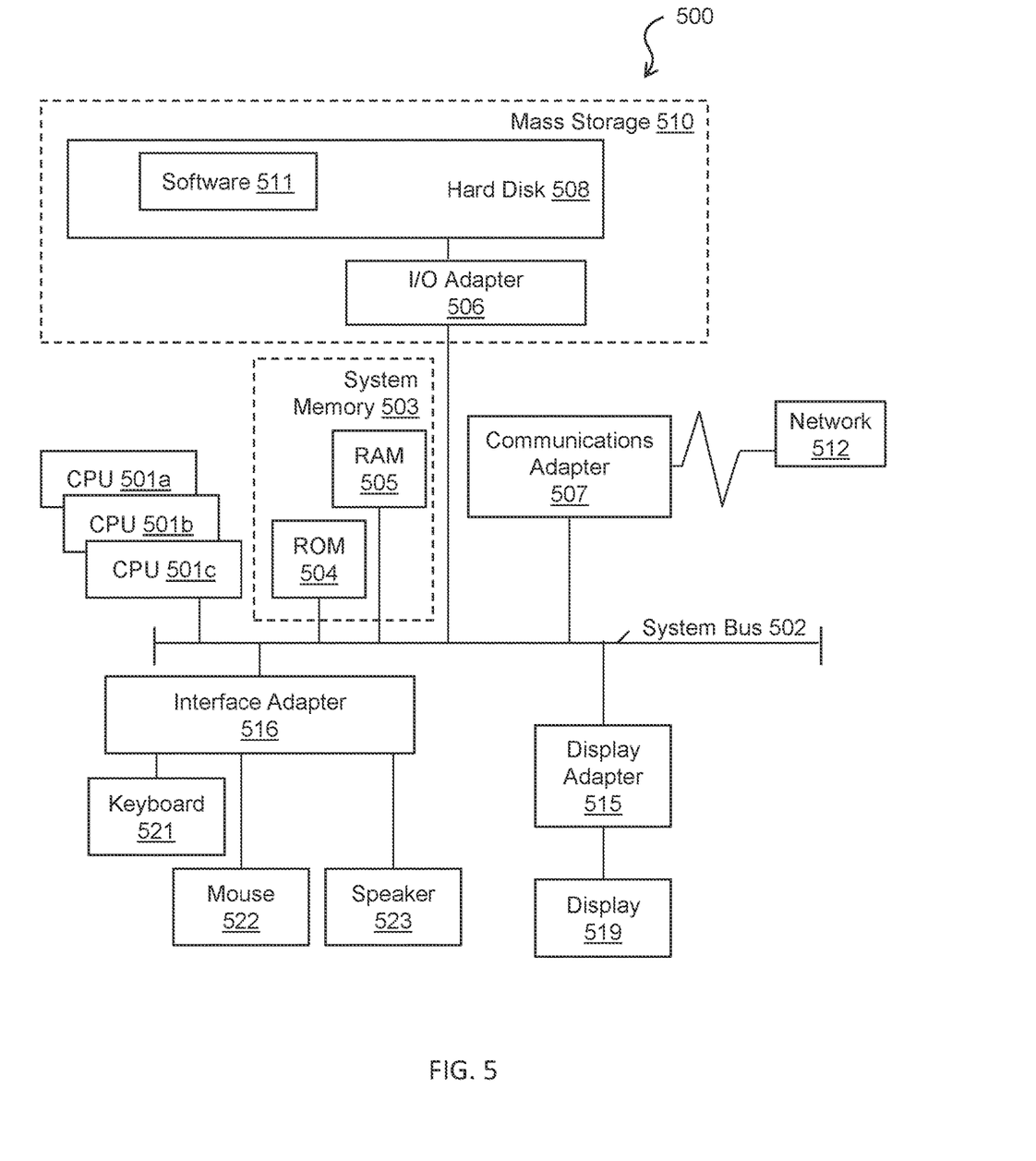

In one or more embodiments of the present invention, the hardware/software modules in the system 100 from FIGS. 1 and 2 can be implemented on the processing system 500 found in FIG. 5. Turning now to FIG. 5, a computer system 500 is generally shown in accordance with an embodiment. The computer system 500 can be an electronic, computer framework comprising and/or employing any number and combination of computing devices and networks utilizing various communication technologies, as described herein. The computer system 500 can be easily scalable, extensible, and modular, with the ability to change to different services or reconfigure some features independently of others. The computer system 500 may be, for example, a server, desktop computer, laptop computer, tablet computer, or smartphone. In some examples, computer system 500 may be a cloud computing node. Computer system 500 may be described in the general context of computer system executable instructions, such as program modules, being executed by a computer system. Generally, program modules may include routines, programs, objects, components, logic, data structures, and so on that perform particular tasks or implement particular abstract data types. Computer system 500 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 5, the computer system 500 has one or more central processing units (CPU(s)) 501a, 501b, 501c, etc. (collectively or generically referred to as processor(s) 501). The processors 501 can be a single-core processor, multi-core processor, computing cluster, or any number of other configurations. The processors 501, also referred to as processing circuits, are coupled via a system bus 502 to a system memory 503 and various other components. The system memory 503 can include a read only memory (ROM) 504 and a random access memory (RAM) 505. The ROM 504 is coupled to the system bus 502 and may include a basic input/output system (BIOS), which controls certain basic functions of the computer system 500. The RAM is read-write memory coupled to the system bus 502 for use by the processors 501. The system memory 503 provides temporary memory space for operations of said instructions during operation. The system memory 503 can include random access memory (RAM), read only memory, flash memory, or any other suitable memory systems.

The computer system 500 comprises an input/output (I/O) adapter 506 and a communications adapter 507 coupled to the system bus 502. The I/O adapter 506 may be a small computer system interface (SCSI) adapter that communicates with a hard disk 508 and/or any other similar component. The I/O adapter 506 and the hard disk 508 are collectively referred to herein as a mass storage 510.

Software 511 for execution on the computer system 500 may be stored in the mass storage 510. The mass storage 510 is an example of a tangible storage medium readable by the processors 501, where the software 511 is stored as instructions for execution by the processors 501 to cause the computer system 500 to operate, such as is described herein below with respect to the various Figures. Examples of computer program product and the execution of such instruction is discussed herein in more detail. The communications adapter 507 interconnects the system bus 502 with a network 512, which may be an outside network, enabling the computer system 500 to communicate with other such systems. In one embodiment, a portion of the system memory 503 and the mass storage 510 collectively store an operating system, which may be any appropriate operating system, such as the z/OS or AIX operating system from IBM Corporation, to coordinate the functions of the various components shown in FIG. 5.

Additional input/output devices are shown as connected to the system bus 502 via a display adapter 515 and an interface adapter 516 and. In one embodiment, the adapters 506, 507, 515, and 516 may be connected to one or more I/O buses that are connected to the system bus 502 via an intermediate bus bridge (not shown). A display 519 (e.g., a screen or a display monitor) is connected to the system bus 502 by a display adapter 515, which may include a graphics controller to improve the performance of graphics intensive applications and a video controller. A keyboard 521, a mouse 522, a speaker 523, etc. can be interconnected to the system bus 502 via the interface adapter 516, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI). Thus, as configured in FIG. 5, the computer system 500 includes processing capability in the form of the processors 501, and, storage capability including the system memory 503 and the mass storage 510, input means such as the keyboard 521 and the mouse 522, and output capability including the speaker 523 and the display 519.

In some embodiments, the communications adapter 507 can transmit data using any suitable interface or protocol, such as the internet small computer system interface, among others. The network 512 may be a cellular network, a radio network, a wide area network (WAN), a local area network (LAN), or the Internet, among others. An external computing device may connect to the computer system 500 through the network 512. In some examples, an external computing device may be an external webserver or a cloud computing node.

It is to be understood that the block diagram of FIG. 5 is not intended to indicate that the computer system 500 is to include all of the components shown in FIG. 5. Rather, the computer system 500 can include any appropriate fewer or additional components not illustrated in FIG. 5 (e.g., additional memory components, embedded controllers, modules, additional network interfaces, etc.). Further, the embodiments described herein with respect to computer system 500 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
    decoding, by a processor, a base address and an offset to generate a first potential memory address and a second potential memory address;
    evaluating, by the processor, a first cell data associated with the first potential memory address of a first partitioned array and a second cell data associated with a second partitioned array of a second partitioned array;
    receiving, by the processor, carry-out bit information from a summing operation of the base address and the offset; and
    selecting, by the processor, one of the first cell data and the second cell data based at least in part on the carry-out bit information.

2. The computer-implemented method of claim 1, wherein the decoding is based at least in part on a most significant bit of the base address and a most significant bit of the offset.

3. The computer-implemented method of claim 1, wherein the summing is based at least in part on an entirety of the base address and an entirety of the offset.

4. The computer-implemented method for claim 1, wherein the summing operation of the base address and the offset is performed in parallel with the decoding.

5. The computer-implemented method of claim 1, wherein the first potential memory address and the second potential memory address are sequential memory addresses.

6. The computer-implemented method of claim 1, wherein the first partitioned array is an even entry array and the second partitioned array is an odd entry array.

7. The computer-implemented method of claim 1, wherein a first bit of the first cell data is evaluated by a first single bitline evaluation circuit and a second bit of the second cell data is evaluation by a second single bitline evaluation circuit.

8. A system comprising:
    a memory having computer readable instructions; and
    one or more processors for executing the computer readable instructions, the computer readable instructions controlling the one or more processors to perform operations comprising:
    decoding a base address and an offset to generate a first potential memory address and a second potential memory address;
    evaluating a first cell data associated with the first potential memory address of a first partitioned array and a second cell data associated with a second partitioned array of a second partitioned array;
    receiving carry-out bit information from a summing operation of the base address and the offset; and
    selecting one of the first cell data and the second cell data based at least in part on the carry-out bit information.

9. The system of claim 8, wherein the decoding is based at least in part on a most significant bit of the base address and a most significant bit of the offset.

10. The system of claim 8, wherein the summing is based at least in part on an entirety of the base address and an entirety of the offset.

11. The system of claim 8, wherein the summing operation of the base address and the offset is performed in parallel with the decoding.

12. The system of claim 8, wherein the first potential memory address and the second potential memory address are sequential memory addresses.

13. The system of claim 8, wherein the first partitioned array is an even entry array and the second partitioned array is an odd entry array.

14. The system of claim 8, wherein a first bit of the first cell data is evaluated by a first single bitline evaluation circuit and a second bit of the second cell data is evaluation by a second single bitline evaluation circuit.

15. A computer program product comprising a computer readable storage medium having program instructions embodied therewith, the program instructions executable by one or more processors to cause the one or more processors to perform operations comprising:
    decoding a base address and an offset to generate a first potential memory address and a second potential memory address;
    evaluating a first cell data associated with the first potential memory address of a first partitioned array and a second cell data associated with a second partitioned array of a second partitioned array;

receiving carry-out bit information from a summing operation of the base address and the offset; and selecting one of the first cell data and the second cell data based at least in part on the carry-out bit information.

16. The computer program product of claim 15, wherein the decoding is based at least in part on a most significant bit of the base address and a most significant bit of the offset.

17. The computer program product of claim 15, wherein the summing is based at least in part on an entirety of the base address and an entirety of the offset.

18. The computer program product of claim 15, wherein the summing operation of the base address and the offset is performed in parallel with the decoding.

19. The computer program product of claim 15, wherein the first potential memory address and the second potential memory address are sequential memory addresses.

20. The computer program product of claim 15, wherein the first partitioned array is an even entry array and the second partitioned array is an odd entry array.

\* \* \* \* \*